United States Patent
Saggio et al.

(10) Patent No.: US 11,270,993 B2
(45) Date of Patent: Mar. 8, 2022

(54) MOSFET DEVICE OF SILICON CARBIDE HAVING AN INTEGRATED DIODE AND MANUFACTURING PROCESS THEREOF

(71) Applicant: STMICROELECTRONICS S.R.L., Agrate Brianza (IT)

(72) Inventors: Mario Giuseppe Saggio, Aci Bonaccorsi (IT); Simone Rascuná, San Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 66 days.

(21) Appl. No.: 16/780,769

(22) Filed: Feb. 3, 2020

(65) Prior Publication Data

US 2020/0176442 A1     Jun. 4, 2020

Related U.S. Application Data

(62) Division of application No. 16/027,060, filed on Jul. 3, 2018, now Pat. No. 10,707,202.

(30) Foreign Application Priority Data

Jul. 5, 2017 (IT) .................. 102017000073767

(51) Int. Cl.
  *H01L 29/808* (2006.01)
  *H01L 27/06* (2006.01)
  (Continued)

(52) U.S. Cl.
  CPC ........ *H01L 27/0629* (2013.01); *H01L 21/046* (2013.01); *H01L 29/0619* (2013.01);
  (Continued)

(58) Field of Classification Search
  CPC ............. H01L 29/0684; H01L 29/0688; H01L 29/6603; H01L 29/66053; H01L 29/66143;
  (Continued)

(56) References Cited

U.S. PATENT DOCUMENTS 6,841,836 B2   1/2005   Saggio et al.
6,979,863 B2   12/2005  Ryu
(Continued)

FOREIGN PATENT DOCUMENTS

EP    0 867 943 A1    9/1998
JP    2009-88326 A    4/2009

OTHER PUBLICATIONS

ST Microelectronics, "Automotive silicon carbide Power MOSFET 650 V, 100 A, 22 mΩ (typ., TJ=150° C.), in an HiP247™ Package," SCTW100N65G2AG Datasheet, May 2016, 9 pages.
(Continued)

*Primary Examiner* — Jae Lee
(74) *Attorney, Agent, or Firm* — Seed IP Law Group LLP

(57) ABSTRACT

An integrated MOSFET device is formed in a body of silicon carbide and with a first type of conductivity. The body accommodates a first body region, with a second type of conductivity; a JFET region adjacent to the first body region; a first source region, with the first type of conductivity, extending into the interior of the first body region; an implanted structure, with the second type of conductivity, extending into the interior of the JFET region. An isolated gate structure lies partially over the first body region, the first source region and the JFET region. A first metallization layer extends over the first surface and forms, in direct contact with the implanted structure and with the JFET region, a JBS diode.

20 Claims, 9 Drawing Sheets

(51) Int. Cl.
  *H01L 29/872* (2006.01)
  *H01L 29/06* (2006.01)
  *H01L 29/10* (2006.01)
  *H01L 29/16* (2006.01)
  *H01L 29/66* (2006.01)
  *H01L 29/78* (2006.01)
  *H01L 21/04* (2006.01)
  *H01L 29/08* (2006.01)
  *H01L 29/423* (2006.01)

(52) U.S. Cl.
  CPC ...... *H01L 29/0696* (2013.01); *H01L 29/0847* (2013.01); *H01L 29/1095* (2013.01); *H01L 29/1608* (2013.01); *H01L 29/4238* (2013.01); *H01L 29/66068* (2013.01); *H01L 29/7806* (2013.01); *H01L 29/872* (2013.01)

(58) Field of Classification Search
  CPC . H01L 29/66893; H01L 29/80; H01L 29/806; H01L 29/808; H01L 29/8086
  See application file for complete search history.

(56) References Cited

U.S. PATENT DOCUMENTS

| | | | |
|---|---|---|---|
| 7,071,062 | B2 | 7/2006 | Saggio et al. |
| 9,583,482 | B2 | 2/2017 | Matocha et al. |
| 9,887,285 | B1* | 2/2018 | Oota .................. H01L 29/7805 |
| 2007/0045727 | A1* | 3/2007 | Shiraishi ............. H01L 29/1095 257/335 |
| 2013/0313570 | A1 | 11/2013 | Sdrulla et al. |
| 2014/0361312 | A1 | 12/2014 | Yoshikawa et al. |
| 2015/0097226 | A1* | 4/2015 | Lichtenwalner ............................ H01L 29/66333 257/329 |
| 2015/0270354 | A1 | 9/2015 | Shimizu et al. |
| 2016/0005883 | A1* | 1/2016 | Yen .................... H01L 21/0495 257/77 |
| 2016/0027878 | A1 | 1/2016 | Uchida et al. |
| 2016/0111533 | A1* | 4/2016 | Yen .................... H01L 29/4238 257/77 |
| 2016/0233210 | A1* | 8/2016 | Matocha ............. H01L 21/0485 |
| 2017/0133503 | A1* | 5/2017 | Matocha ............. H01L 27/0629 |
| 2017/0194438 | A1* | 7/2017 | Kumagai ............. H01L 29/1608 |
| 2017/0278924 | A1 | 9/2017 | Bolotnikov et al. |
| 2017/0345891 | A1 | 11/2017 | Van Brunt et al. |
| 2018/0090574 | A1 | 3/2018 | Matsumura et al. |
| 2018/0331174 | A1* | 11/2018 | Tega .................... H01L 21/0465 |
| 2019/0131388 | A1* | 5/2019 | Watanabe .............. H01L 29/78 |

OTHER PUBLICATIONS

ST Microelectronics, "Silicon carbide Power MOSFET 1200 V, 45 A, 90 mΩ (typ., TJ=150° C.) in an HiP247™ Package," SCT30N120 Datasheet, May 2017, 13 pages.

\* cited by examiner

MOSFET DEVICE OF SILICON CARBIDE HAVING AN INTEGRATED DIODE AND MANUFACTURING PROCESS THEREOF

BACKGROUND

Technical Field

The present disclosure relates to a MOSFET device of silicon carbide having an integrated diode and the manufacturing process thereof.

Description of the Related Art

As is known, vertical-conduction MOSFET ("metal oxide semiconductor field-effect transistor") transistors are often used as synchronous rectifiers, for example in applications with bridge configurations, such as DC/DC converters.

In particular, MOSFET transistors made of silicon carbide (SiC) have recently been provided, by virtue of their characteristics of reduction in the power losses and smaller dimensions.

One example of a MOSFET transistor (hereinafter, also defined as device 1) formed from silicon carbide is shown in FIGS. 1 and 2.

In detail, the device 1 comprises a body 2, of silicon carbide, with a first type of conductivity (for example, of the N type), having an upper surface 2A and a lower surface 2B.

Typically, the body 2 is formed by a substrate 17 (forming the lower surface 22B) and by an epitaxial layer 16 (forming the upper surface 22A). The body 2 accommodates a first and a second body region 3, 5, with a second type of conductivity (in the example being considered, of the P type), disposed at a distance from one another and extending in a direction parallel to a first axis Y of a reference frame XYZ; furthermore, the body regions 3, 5 extend from the upper surface 2A into the interior of the body 2 (in a direction parallel to a second axis Z of the reference frame XYZ).

The body regions 3, 5 thus bound in the body 2 an intermediate region 15, facing the upper surface 2A.

The body regions 3, 5 respectively accommodate a first and a second source region 4, 6, of the N type, extending from the upper surface 2A into the interior of the body regions 3, 5.

A plurality of enriched regions 7A-7D, of the P type and with a high doping level, extend from the first surface 2A of the body 2 into the interior of the source regions 4, 6 down to a greater depth compared with the latter, but nevertheless smaller compared with that of the body regions 3, 5. In particular, the enriched regions 7A-7D comprise first enriched regions 7A and 7C (FIG. 2) extending through the first source region 4 and mutually aligned in a direction parallel to a third axis X of the reference frame XYZ. Furthermore, the enriched regions 7A-7D comprise second enriched regions 7B and 7D, extending through the second source region 6 and mutually aligned in a direction parallel to the third axis X (as can in particular be seen in FIG. 2).

As shown in FIG. 1, an insulating region 8, for example of silicon oxide ($SiO_2$), extends over the upper surface 2A. In detail, the insulating region 8 extends on top of the intermediate region 15 and, partially, on top of one end of both the body regions 3, 5 and of one end of both the source regions 4, 6.

A conductive region 9, of polysilicon, extends over the insulating region 8. A layer of dielectric 10, for example of silicon oxide, covers the top and the sides of the conductive region 9.

The insulating region 8, the conductive region 9 and the layer of dielectric 10 form an isolated gate region 12; the conductive region 9 is furthermore electrically coupled to a gate terminal G of the device 1.

Furthermore, an upper metallization layer 13 (shown with dashed lines) extends over the entire upper surface 2A and a lower metallization layer 11 extends over the entire lower surface 2B, in such a manner as to guarantee the electrical connection and the operation of the device 1.

In particular, the upper metallization layer 13 forms, in contact with the source regions 4, 6, a source terminal S of the device 1.

The lower metallization layer 11 forms, in contact with the body 2, a drain terminal D of the device 1.

The junction between the body 2 and the lower metallization layer 11 forms, inside of the device 1, a diode known as "body-drain diode" which can operate alternately to the device 1 in a conduction phase, as desired in some applications, for example when the device 1 is used in a bridge configuration.

The solution shown in FIGS. 1 and 2 has some drawbacks.

Indeed, the body-drain diode in the device 1 has high switching times, a high voltage drop (greater than 2 V) and can emit electromagnetic radiation, reducing the performance of the device 1.

With the aim of solving the problems listed and increasing the efficiency of the device 1, various solutions have been proposed.

For example, one solution proposed is to form a diode, for example of the Schottky or JBS (Junction-Barrier Schottky) type, in parallel with the MOSFET transistor and in the same package; indeed, by means of the parallel structure, it is possible to improve the performance characteristics of the MOSFET transistor in applications with a bridge configuration. However, such a solution is bulky and economically costly and, hence, not usable in all the applications.

The U.S. Pat. No. 7,071,062 A2 describes a MOSFET device, in which a Schottky diode is integrated with a MOS transistor in one and the same body of silicon. However, the solution described in this patent, and in particular the process flow presented in it cannot be immediately applied to silicon carbide devices, in that the temperatures of activation of the silicon carbide are very high (higher than 1600° C.) and can damage the conductive region of polysilicon belonging to the isolated gate region 12.

In the patent US 2013/0313570 A1, a silicon carbide MOSFET device is proposed with a structure similar to that presented in the U.S. Pat. No. 7,071,062; in the case of US 2013/0313570 A1, in the MOSFET transistor, a contact of the Schottky type is formed in the body region in contact with a first metallization layer and an ohmic contact in the source region in contact with a second metallization layer. The two metallization layers are formed using different metals. However, this solution does not allow the dimensions of the elementary cells of the MOSFET device to be reduced, since it teaches the formation of Schottky contacts inside of these elementary cells.

BRIEF SUMMARY

According to at least one embodiment of the present disclosure, an integrated MOSFET device includes:

a body, of silicon carbide and with a first type of conductivity, having a first surface and a second surface;
a first body region with a second type of conductivity, extending from the first surface into the body;
a junction field effect transistor (JFET) region adjacent to the first body region and facing the first surface;
a first source region, with the first type of conductivity, extending from the first surface into the first body region;
an isolated gate structure extending over the first surface and lying partially over the first body region, the first source region and the JFET region;
an implanted structure, with the second type of conductivity, extending into the JFET region from the first surface; and
a first metallization layer extending over the first surface, the first metallization layer being in direct contact with the implanted structure and with the JFET region and forming a Junction-Barrier Schottky (JBS) diode that includes the implanted structure and the JFET region.

According to at least one embodiment of the present disclosure, a manufacturing process includes:
forming a first body region in a body of silicon carbide having a first type of conductivity, a first surface, and a second surface, the first body region having a second type of conductivity and extending from the first surface into the body, the first body region bounding a JFET region of the body, the JFET region extending from the first surface;
forming a first source region, with the first type of conductivity, extending from the first surface into the first body region;
forming an implanted structure, with the second type of conductivity, inside of the JFET region, starting from the first surface;
forming an isolated gate structure, on the first surface in a position lying partially over the first body region, the first source region, and the JFET region; and
forming a first metallization layer on the first surface in direct contact with the implanted structure and with the JFET region, the first metallization layer forming a JBS diode with the implanted structure and the JFET region.

BRIEF DESCRIPTION OF THE SEVERAL VIEWS OF THE DRAWINGS

For the understanding of the present disclosure, some of the preferred embodiments thereof will now be described, purely by way of non-limiting example, with reference to the appended drawings, in which.

DETAILED DESCRIPTION

Figure 3:
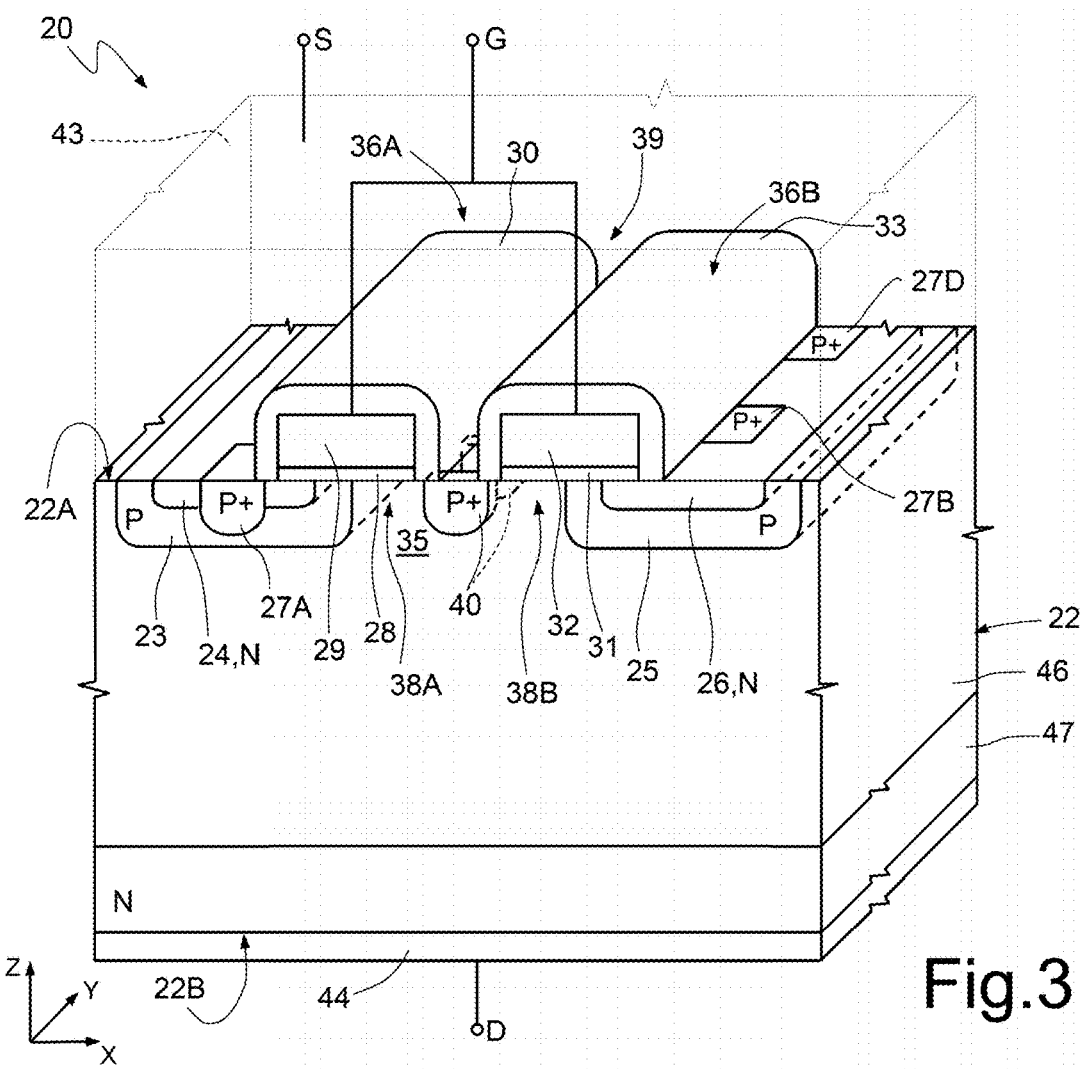
FIG. 3 shows a cross-sectional perspective view of the present MOSFET device according to one embodiment.
Figure 4:
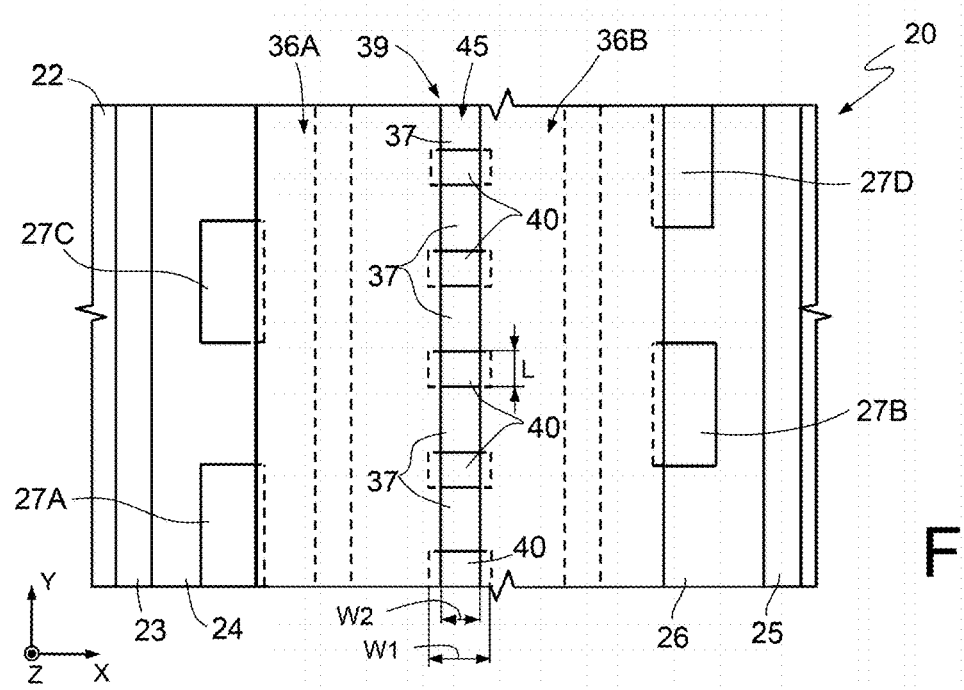
FIG. 4 shows a view from above of the MOSFET device in FIG. 3.
Figure 5:
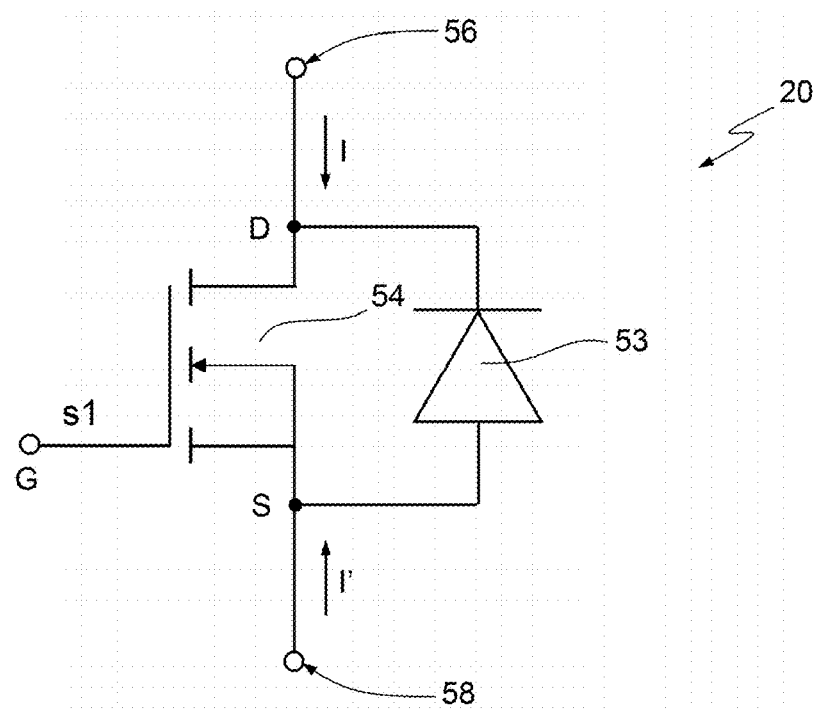
FIG. 5 shows an equivalent circuit diagram of the MOSFET device in FIGS. 3 and 4.

FIGS. 3-5 show a device 20 including a MOSFET transistor 54 and a JBS (Junction-Barrier Schottky) diode 53, in parallel with the MOSFET transistor 54 (see, in particular, the electrical equivalent in FIG. 5).

As shown in detail in FIGS. 3 and 4, the device 20 is formed here in a body 22, of silicon carbide, with a first type of conductivity (for example, of the N type), having an upper surface 22A and a lower surface 22B.

The body 22 is formed by a substrate 47 (defining the lower surface 22B) and by an epitaxial layer 46 (defining the upper surface 22A).

The body 22 accommodates a first and a second body region 23, 25, with a second type of conductivity (for example, of the P type) disposed at a distance from one another and extending in a direction parallel to a first axis Y of a reference frame XYZ; furthermore, the body regions 23, 25 extend from the upper surface 22A into the interior of the body 22 (in a direction parallel to a second axis Z of the reference frame XYZ).

The body regions 23, 25 thus bound within the body 22 an intermediate region, henceforth referred to as the JFET (Junction Field-Effect Transistor) region 35, facing the upper surface 22A. The JFET region 35 accommodates a plurality of implanted regions 40, of the P type, extending into the interior of the body 22 from the upper surface 22A.

The implanted regions 40 have a width W1, in a direction parallel to a third axis X of the reference frame XYZ, less than the distance between the body regions 23, 25, and a length L in a direction parallel to the first axis Y. For example, the width W1 may be in the range between 0.5 µm and 5 µm, in particular equal to 1 µm, and the length L may be in the range between 0.5 and 5 µm, in particular equal to 1 µm. The implanted regions 40 are mutually aligned in a direction parallel to the first axis Y and bound between them a plurality of intermediate contact portions 37 of the JFET region 35; furthermore, each implanted region 40 is equispaced from the successive one and from the preceding one in a direction parallel to the first axis Y (for example, each implanted region 40 may be separated from the adjacent implanted regions by a distance in the range between 0.5 µm and 5 µm, in particular equal to 1 µm).

The body regions 23, 25 respectively accommodate a first and a second source region 24, 26, of the N type, extending from the upper surface 22A into the interior of the body regions 23, 25.

A plurality of enriched regions 27A-27D, of the P type and with a high doping level (for example, greater than $5 \cdot 10^{18}$ atoms/cm$^3$) extends from the first surface 22A of the body 22 into the interior of the source regions 24, 26 over a greater depth compared with the latter, but nevertheless smaller compared with that of the body regions 23, 25.

In particular, the enriched regions 27A-27D comprise first enriched regions 27A and 27C (FIG. 4), extending through the first source region 24 and mutually aligned in a direction parallel to the first axis Y, and second enriched regions 27B and 27D, extending through the second source region 26 and mutually aligned in a direction parallel to the first axis Y (as can in particular be seen in FIG. 4).

In the exemplary embodiment shown, the first enriched regions 27A, 27C are offset by a half-step in the Y-direction with respect to the second enriched regions 27B, 27D (as can be seen in FIG. 4). As shown in FIG. 3, on the upper surface 22A, a first and a second insulating region 28, 31, for example of silicon oxide ($SiO_2$), extend, forming gate oxide regions.

In detail, the first insulating region 28 lies partially over the implanted regions 40, extending on top of a first JFET portion 38A and, partially, on top of the first source region 24 and of the first body region 23. In an analogous manner, the second insulating region 31 lies partially over the implanted regions 40, extending on top of a second JFET portion 38B and, partially, on top of the second source region 26 and of the second body region 25.

A first and a second conductive region 29, 32, forming gate regions, of polysilicon, respectively extend over the first and over the second insulating region 28, 31 and are electrically coupled to a gate terminal G of the device 20. A first and a second dielectric region 30, 33, for example of silicon oxide, respectively extend over the first and a second conductive region 29, 32 and cover them on the top and on the sides.

The first insulating region 28, the first conductive region 29 and the first dielectric region 30 form a first isolated gate region 36A; the second insulating region 31, the second conductive region 32 and the second region of dielectric 33 form a second isolated gate region 36B. The first and the second isolated gate regions 36A, 36B form a gate structure 39.

As can be seen in particular in FIG. 4, the first and the second isolated gate region 36A, 36B extend at a distance from one another and are mutually separated by a gap 45 having a width W2, for example, smaller than the width W1 of the implanted regions 40.

Furthermore, an upper metallization layer 43 (shown in transparency in FIG. 3) extends over the entire upper surface 22A and a lower metallization layer 44 extends over the entire lower surface 22B, in such a manner as to allow the electrical connection and the operation of the device 20.

In particular, the lower metallization layer 44, in contact with the body 22, forms the drain terminal D of the device 20.

The upper metallization layer 43 forms a source terminal S of the device 20, in direct contact with the source regions 24, 26; furthermore, the upper metallization layer 43 extends between the isolated gate regions 36A, 36B, within the gap 45, where it is in contact with both the implanted regions 40 in the JFET region 35, here forming an ohmic contact, and with the intermediate contact portions 37, here forming a Schottky contact. The device 20 in FIGS. 3-4 (the electrical equivalent can be seen in FIG. 5) thus forms a JBS diode 53 in parallel with the MOSFET transistor 54, the latter being formed by the body 22, by the source regions 24, 26 and by the gate structure 39.

With reference to FIG. 5, the JBS diode 53 has its cathode terminal coupled to a first conduction node 56 and its anode terminal coupled to a second conduction node 58. For example, the first conduction node 56 may be a power supply node and the second conduction node may be coupled to a ground line. As an alternative, if the device 20 is used in a bridge structure, the conduction nodes 56, 58 may be connected to a first line at a reference potential (for example a power supply line), to a load and/or to a second line at a reference potential (ground line).

The MOSFET transistor 54 has a gate terminal G designed to receive a control signal s1, a drain terminal D coupled to the first conduction node 56 and a source terminal S coupled to the second conduction node 58. Furthermore, the source terminal S is short-circuited with the body regions 23, 25 of the MOSFET transistor 54.

Furthermore, as indicated, the JBS diode 53 is formed by the electrical contact between the upper metallization layer 43, the implanted regions 40 and the intermediate portions 37 in FIGS. 3 and 4.

In use, in a first phase, the control signal s1 is high and commands the MOSFET transistor 54 to turn on; as a result, the MOSFET transistor 54 conducts, allowing a current I to flow from the first conduction node 56 to the second conduction node 58, through the MOSFET transistor 54. In this first phase, the JBS diode 53 is non-conducting.

In a second phase, the control signal s1 is low and the MOSFET transistor 54 is off. In contrast, in this second phase, the JBS diode 53 is conducting and, accordingly, a current I' can flow from the second conduction node 58 to the first conduction node 56 through the JBS diode 53.

In this mode, the device 20 may advantageously be used in bridge structures in which it is desired for the MOSFET transistor 54 and the JBS diode 53 to work alternately.

Figure 6:
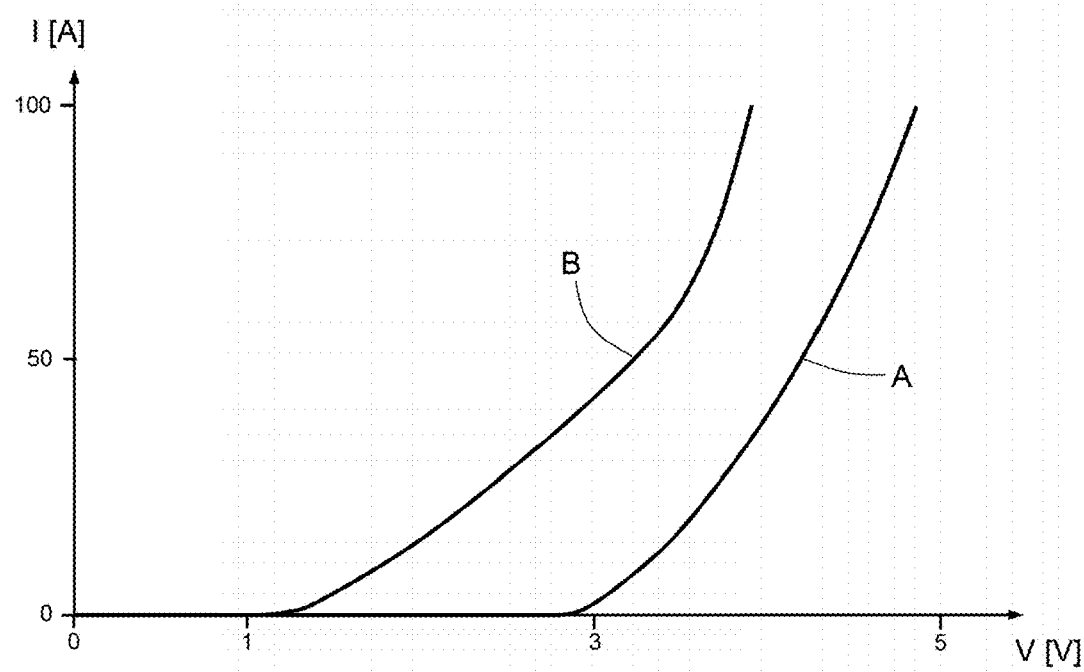
FIG. 6 shows electrical characteristics of the MOSFET device in FIGS. 3 and 4 and of a standard MOSFET transistor.

The device 20 described offers the following advantages. It has a high efficiency by virtue of the presence of the JBS diode 53 in FIG. 5 which allows the ignition voltage of the device to be reduced, as shown in FIG. 6, illustrating the voltage-current characteristic in the case of a conventional MOSFET transistor (curve A) and in the case of the device 20 (curve B).

Furthermore, the device 20 described offers reduced manufacturing costs compared with discrete solutions, in which a MOSFET transistor and a diode are disposed within separate wafers and reunited in the same package.

The device 20 in FIGS. 3 and 4 may be manufactured as shown in FIGS. 7-11.

Figure 7:
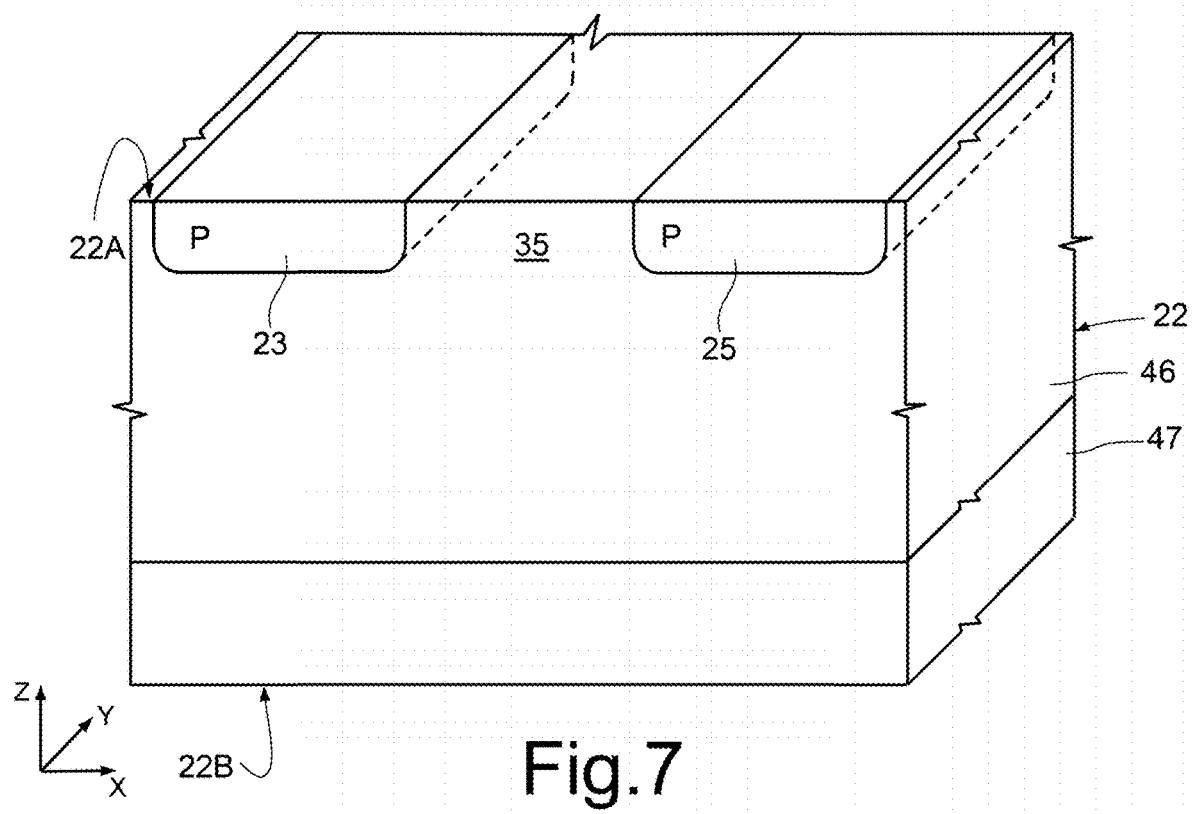
FIGS. 7-11 show cross-sectional perspective views of the device in FIGS. 3 and 4, in successive manufacturing steps.

In FIG. 7, by means of known masking and implantation techniques, doping ionic species of the P type (for example, aluminium) are implanted into the body 22 in such a manner as to form the body regions 23, 25. In particular, the implantation may comprise an implantation sequence at various implantation energies.

For example, these implantations may take place at a dose in the range between $5 \cdot 10^{13}$ and $5 \cdot 10^{14}$ atoms/cm², in particular equal to $1 \cdot 10^{14}$ atoms/cm² with an implantation energy in the range between 20 and 600 keV. In this way, inside the body 22, between the body regions 23, 25, the JFET region 35 is formed.

Figure 8:
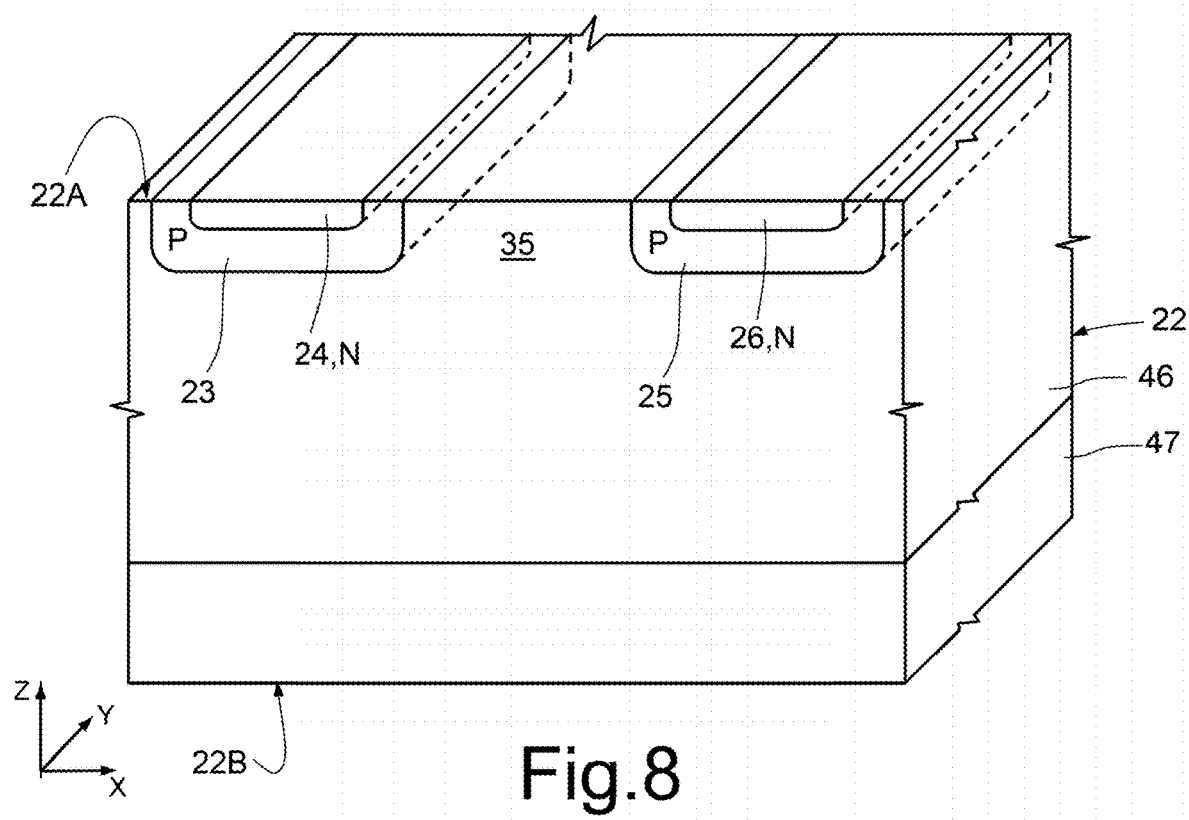

Subsequently, in FIG. 8, using known masking and implantation techniques, an implantation of doping ionic species of the N type, such as nitrogen or phosphorous, is carried out in such a manner as to form the first source region 24 in the first body region 23 and the second source region 26 in the second body region 25. For example, this implantation may take place at a dose in the range between $5 \cdot 10^{14}$ and $1 \cdot 10^{16}$ atoms/cm², in particular equal to $5 \cdot 10^{15}$ atoms/cm², with an implantation energy, for example, in the range between 20 keV and 300 keV.

Figure 9:
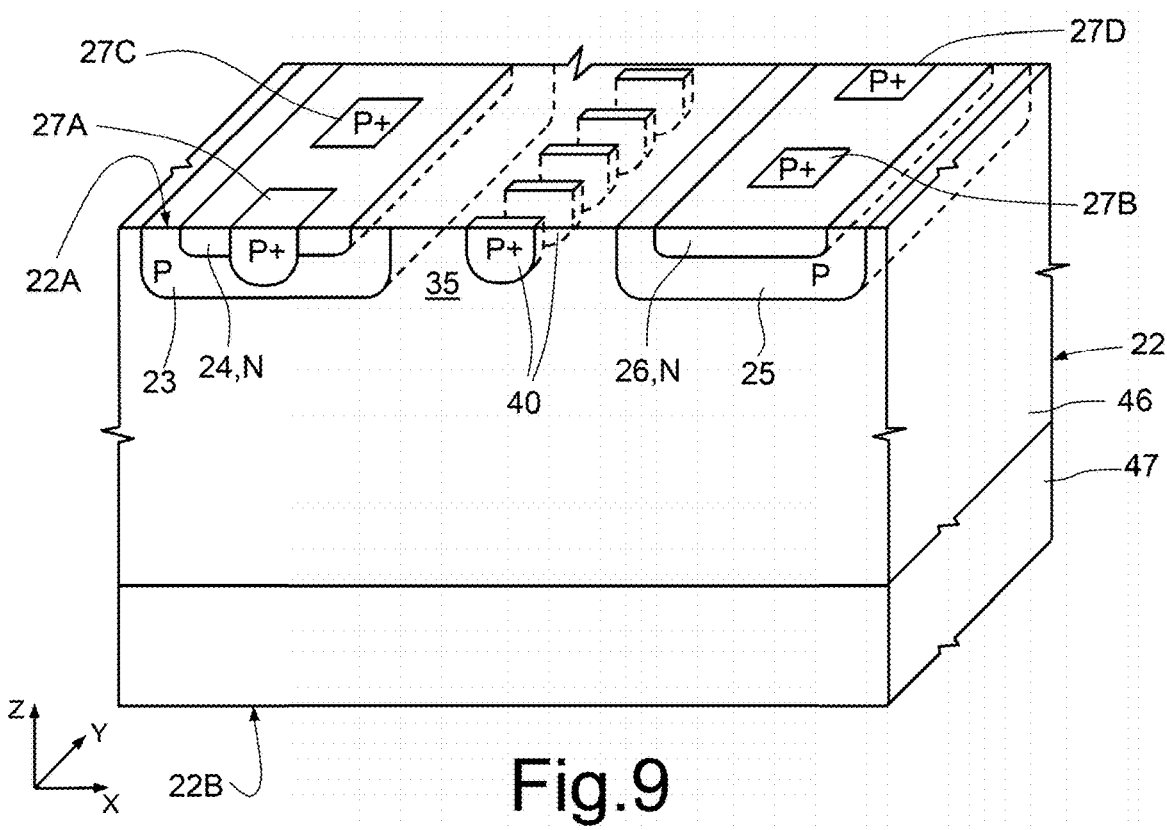

With reference to FIG. 9, simultaneously and using a single mask, the implantation of doping ionic species of the P type (for example, aluminium) into the implanted regions 40 and into the enriched regions 27A-27D is carried out by means of known masking and implantation techniques. For example, this implantation may take place at a dose in the range between $5 \cdot 10^{14}$ and $1 \cdot 10^{16}$ atoms/cm$^2$, in particular equal to $5 \cdot e^{15}$ atoms/cm$^2$ (with an implantation energy in the range between 20 keV and 300 keV).

Subsequently, an activation step is carried out, in which the body 22 is heated to high temperature (for example in the range between 1600° C. and 1800° C., in particular to 1700° C.) in order to obtain the activation of the doping ionic species and to complete the implantation process. The implanted regions 40 and the enriched regions 27A-27D thus formed exhibit a higher doping level compared with body regions 23, 25.

Figure 10:
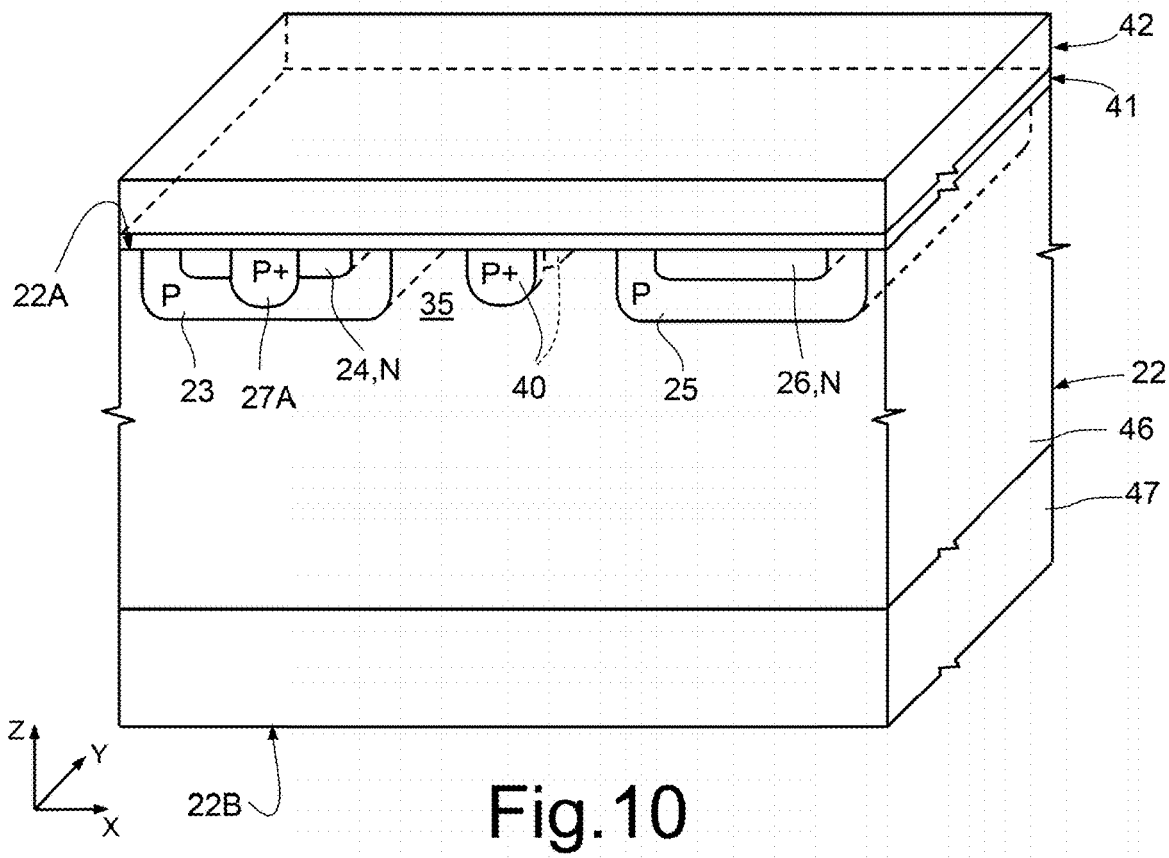

Thus, in FIG. 10, using known deposition techniques, a gate oxide layer 41, of insulating material, for example silicon oxide, intended to form the insulating regions 28, 31, is deposited over the entire upper surface 22A. Subsequently, on one surface of the gate oxide layer 41 and over its entire extension, a gate layer 42, of conductive material, such as polysilicon, intended to form the conductive regions 29, 32, is deposited.

Figure 11:
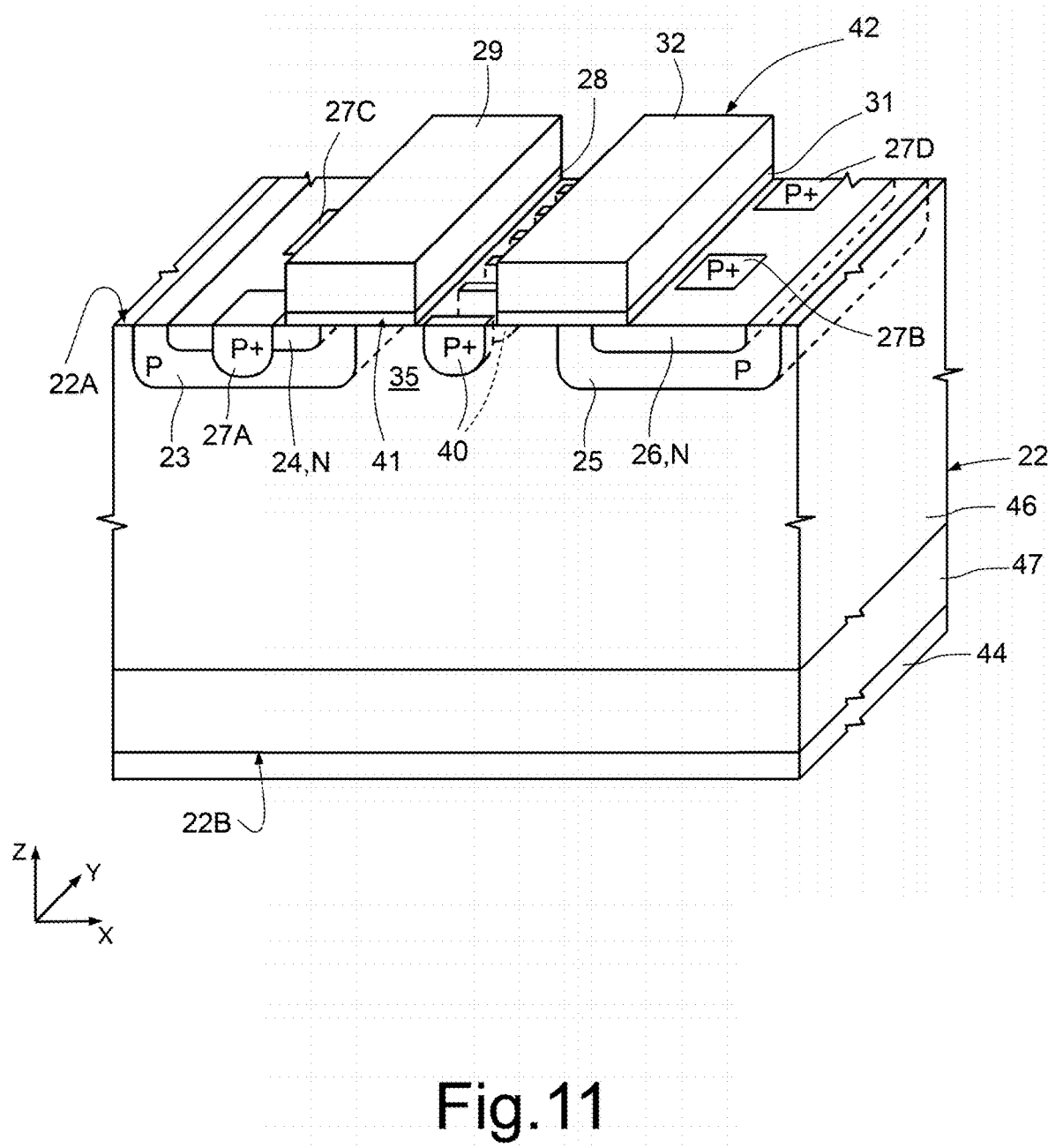

Subsequently, in FIG. 11, the gate layer 42 and the oxide layer 41 are defined according to known photolithographic techniques, thus forming the insulating regions 28, 31 and the conductive regions 29, 32. In detail, the alignment of the masks for the photolithographic definition of the insulating regions 28, 31 and conductive regions 29, 32 with respect to the implanted regions 40 and to the enriched regions 27A-27D takes place by means of common "Zero Layer" techniques, namely taking advantage of the dedicated trenches in non-active regions.

Subsequently, on top of the structure thus formed, an insulating layer (not shown) is deposited and defined by means of known deposition and definition techniques, in such a manner as to form the regions of dielectric 30, 33. The first and the second isolated gate structures 36A, 36B, and therefore the gate structure 39, are thus obtained.

Thus, the lower metallization layer 44 is deposited on the lower surface 22B and the upper metallization layer 43 is deposited on the upper surface 22A, using known deposition and definition techniques. The usual final steps thus follow, including the formation of a passivation layer, dicing, etc., obtaining, in such a manner, the device 20 in FIGS. 3 and 4.

In this way, the JBS diode 53 in FIG. 5 may be formed in a manner integrated into the device prior to the formation of the isolated gate regions 36A, 36B, and the high activation temperatures of the silicon carbide do not risk damaging the overlying polysilicon structures.

This is obtained by modifying only three masks: the enrichment mask, which here allows the implanted regions 40 and the enriched regions 27A-27D to be simultaneously formed; the mask for the conductive layer 29, 32, which leads to the formation of two, physically separate, isolated gate regions 36A, 36B; and the mask for the contacts, which here allows the layer of dielectric (which forms the regions of dielectric 30, 33) to be removed between the isolated gate regions 36A, 36B, for the contact with the JBS diode (53 in FIG. 5).

In the device 20, the ratio between the area of the ohmic contact and the area of the Schottky contact determines the ignition point and the slope of the electrical characteristic for the MOSFET transistor when the body-drain diode is biased directly; as a result, by varying this ratio, it is possible to vary the characteristics of the device 20. In particular, this ratio may be varied by either modifying the relative dimensions of these areas or by modifying the geometry of the MOSFET device.

In this regard, FIGS. 12-16 show embodiments having various geometries with the aim of obtaining different electrical characteristics.

Figure 12:
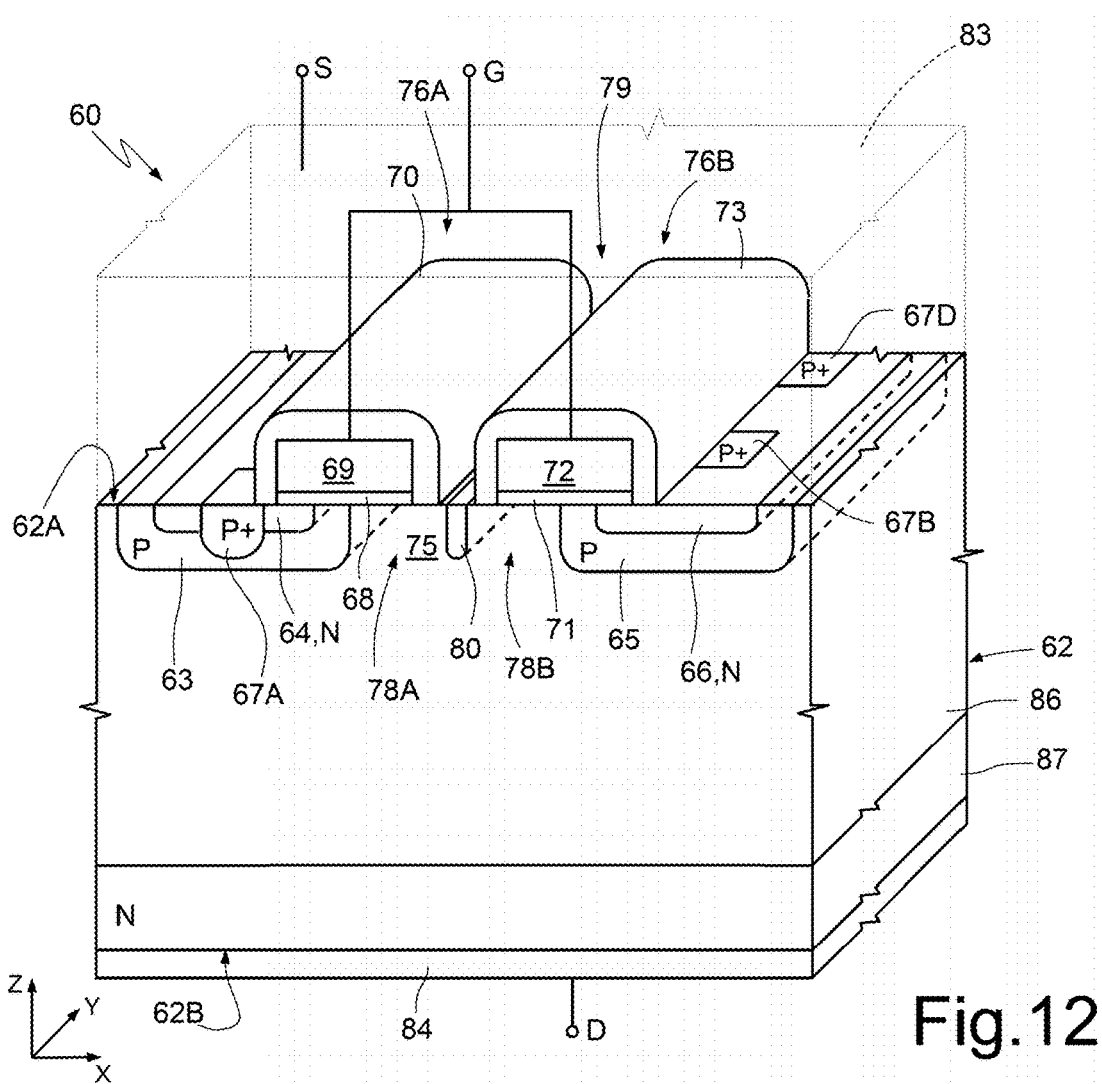
FIG. 12 shows a cross-sectional perspective view of the present device according to another embodiment.
Figure 13:
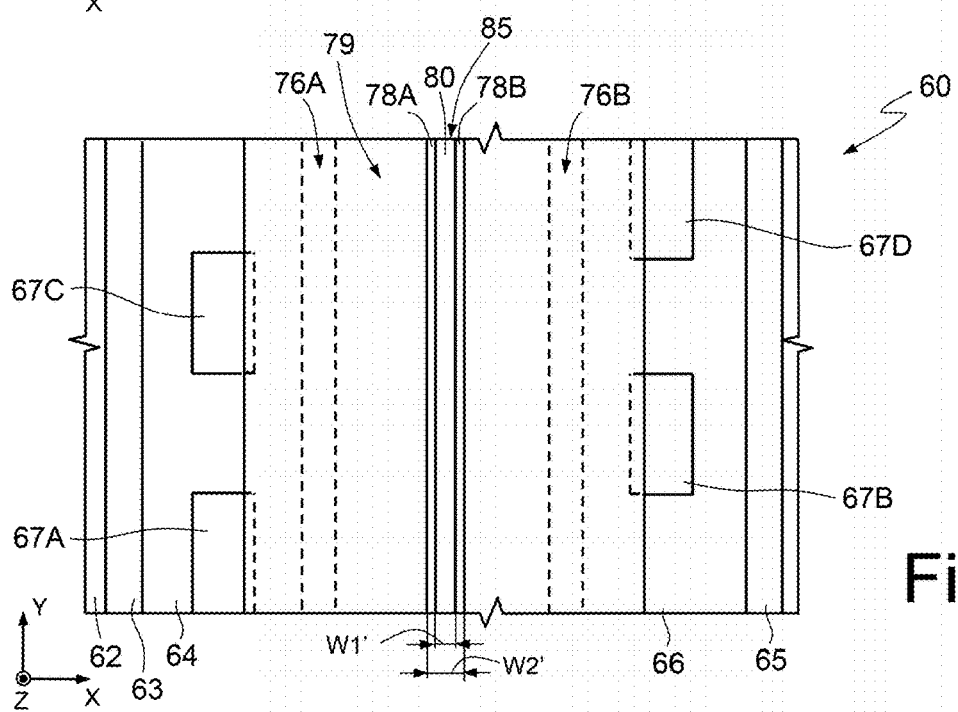
FIG. 13 shows a view from above of the device of FIG. 12.

In particular, FIGS. 12 and 13 show another embodiment of the present device, here indicated with the reference number 60, in which the implanted regions 40 are substituted by a single implanted region 80 and this has a smaller width W1' (in a direction parallel to the third axis X) compared with the lateral extension of the implanted regions 40 of the device 20.

The device 60 is equivalent to the device 20 in FIGS. 3 and 4, for which parts similar to those shown and described with reference to FIGS. 3 and 4 are indicated in FIGS. 12 and 13 with reference numbers increased by 40 and will not be described any further.

In detail, the width W1' of the implanted region 80 of the device 60 is smaller compared with the distance (W2' in FIG. 13) between the isolated gate regions, here indicated with 76A, 76B, and it extends over a greater length (in a direction parallel to the first axis Y) compared with the device 20. For example, the implanted region 80 of the device 60 may extend over practically the entire length (in a direction parallel to the first axis Y) of the device 60. As an alternative, if desired, the implanted region 80 may be interrupted at some points along its length or may extend only over a part of the length (in direction Y) of the device 20.

In the device 60 in FIGS. 12 and 13, the portions of the JFET region 75 included between the edges of the implanted region 80 and the edges of the isolated gate regions 76A, 76B thus form lateral contact regions 78A, 78B.

In practice, the implanted region 80 has the shape of a thin strip extending inside of the JFET region 75 of the body 62 and facing the upper surface 62A; furthermore, the lateral contact regions 78A, 78B are not covered by the isolated gate regions 76A, 76B and are in direct contact with the upper metallization layer 83.

Thus, in this case, the intermediate contact portions 37 are missing and the Schottky contact is formed between the upper metallization layer 83 and the lateral contact portions 78A, 78B. Furthermore, in a similar manner to the implanted regions 40 of the device 20, the implanted region 80 forms an ohmic contact with the upper metallization layer 83.

Figure 14:
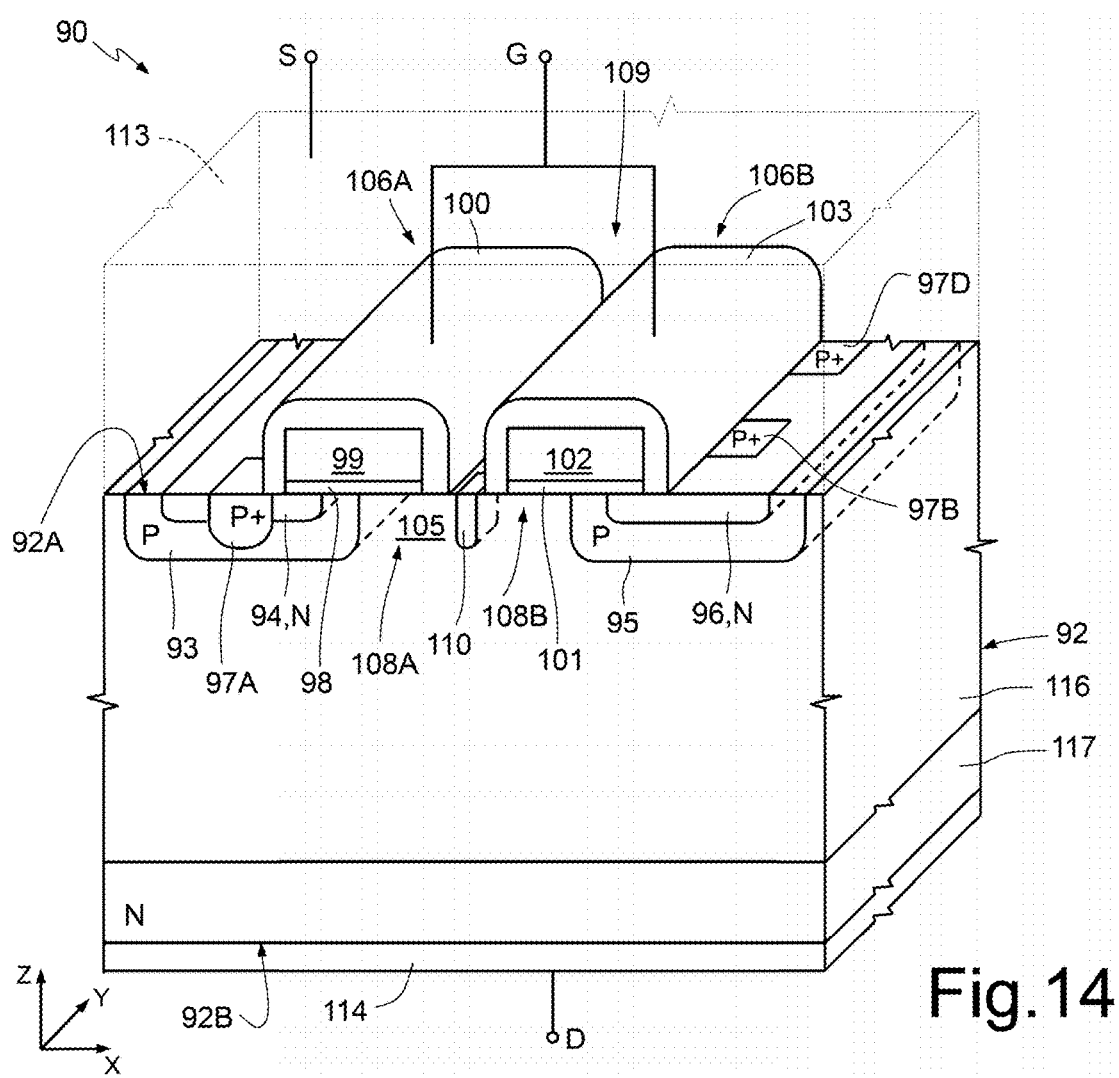
FIG. 14 shows a cross-sectional perspective view of the present device according to a further embodiment.
Figure 15:
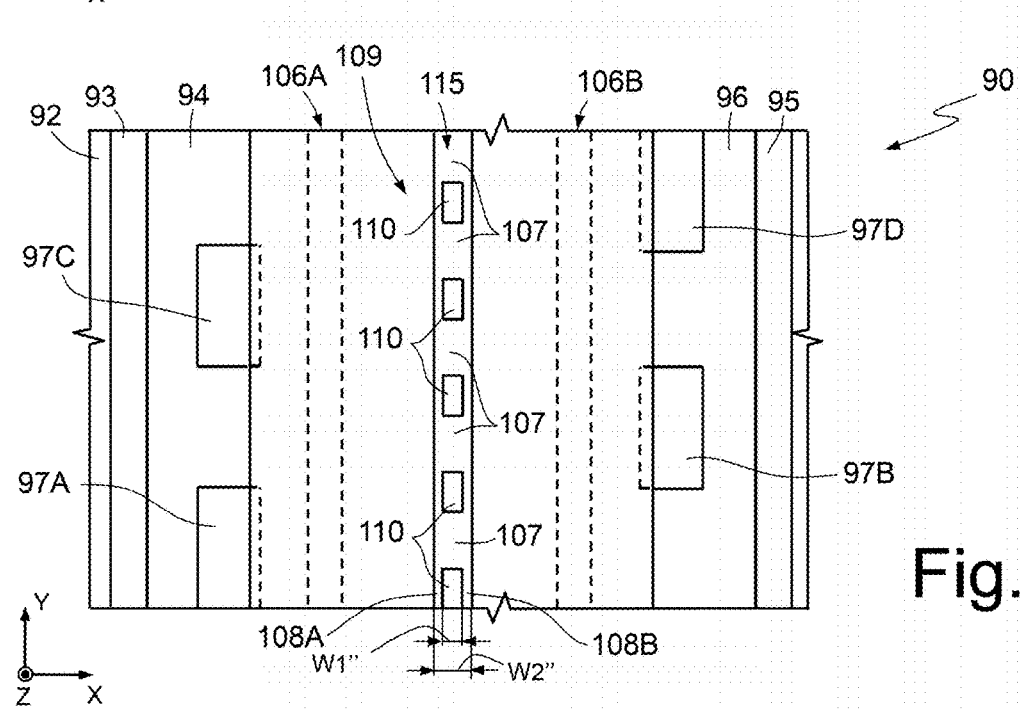
FIG. 15 shows a view from above of the device according to FIG. 14.

FIGS. 14 and 15 show a further embodiment of the present device, here indicated with the reference number 90, comprising a plurality of implanted regions, here indicated with 110, with a width that is smaller compared with the lateral extension of the plurality of implanted regions 40 in FIGS. 3 and 4.

In the device 90, parts similar to those shown and described with reference to FIGS. 3 and 4 are indicated in FIGS. 14 and 15 with reference numbers increased by 70 and will not be described any further.

In the device 90, the implanted regions 110 have a width W1", in a direction parallel to the third axis X, that is smaller with respect to the distance W2" between the isolated gate regions, here indicated with 106A, 106B, in a similar manner to the device 60 in FIGS. 12 and 13. In contrast, in a similar manner to FIGS. 3 and 4, the implanted regions 110 are aligned and are placed equidistant in a direction parallel to the first axis Y.

As a consequence, in the device 90 both intermediate contact regions 107 and lateral contact regions 108A, 108B are present.

Thus, also in this case, the device 90 has both a Schottky contact (between the upper metallization layer 113 and the intermediate contact regions 107, together with the lateral contact regions 108A, 108B) and an ohmic contact (between the upper metallization layer 113 and the implanted regions 110).

Figure 1:
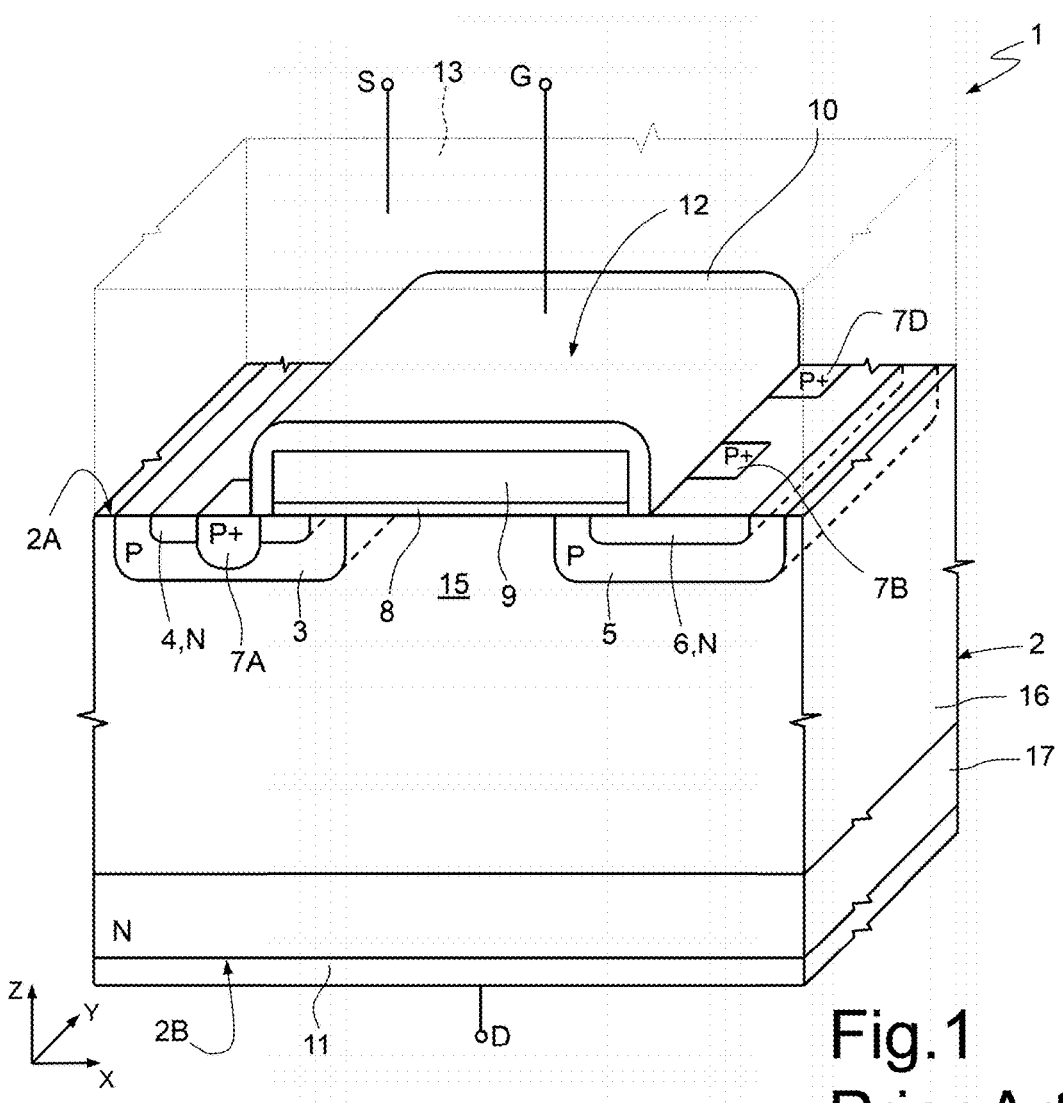
FIG. 1 shows a cross-sectional perspective view of a known device.
Figure 2:
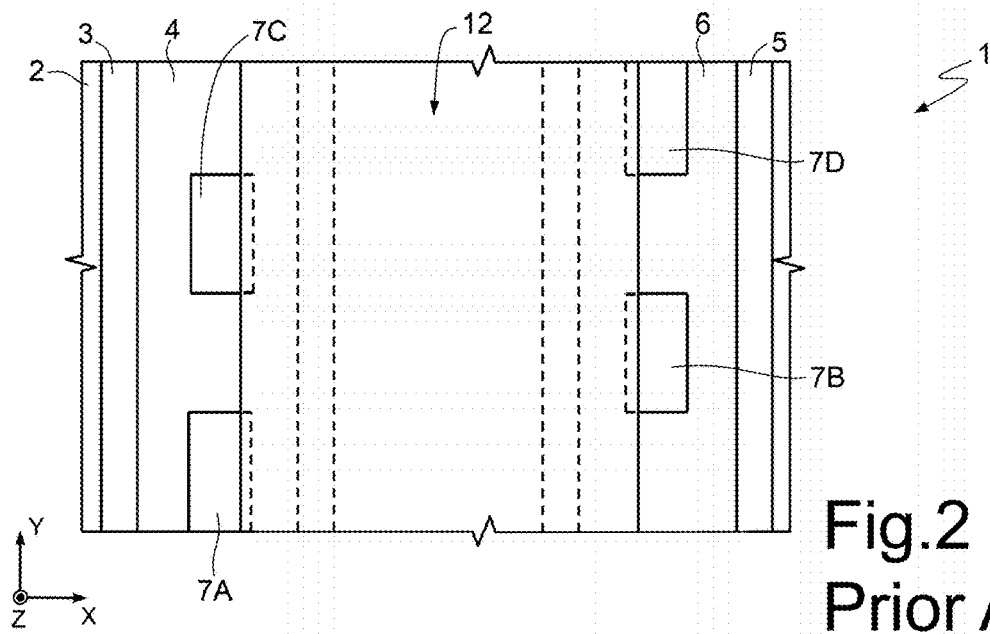
FIG. 2 shows a view from above of the device in FIG. 1.
Figure 16:
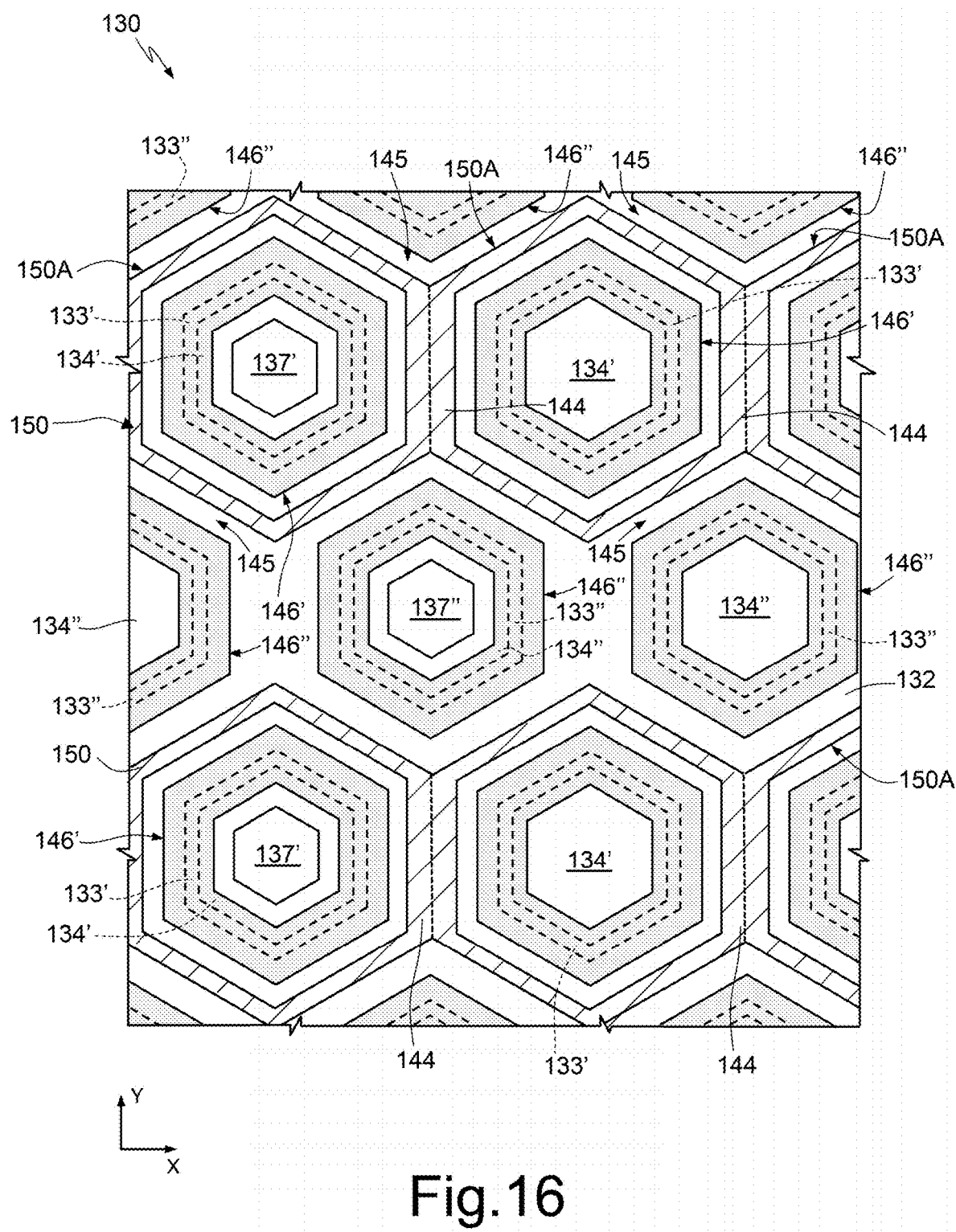
FIG. 16 shows a view from above, with layers removed for clarity, of one alternative embodiment of the present device.

FIG. 16 shows a different embodiment of a MOSFET device, here indicated with the reference number 130, having a configuration with hexagonal cells. In FIG. 16, for clarity of the figure, the upper metallization layer (13 in FIG. 1) has not been shown.

The device 130 is conceptually analogous to the device 20 in FIGS. 3 and 4; thus, elements common to the device 20 have been indicated, in FIG. 15, with reference numbers increased by 110.

In detail, a body 132, of silicon carbide and with the first type of conductivity, accommodates a plurality of implanted regions 150 of the P type.

Each implanted region 150 is formed by a series of hexagonal frames 150A, disposed aligned to one another in a direction parallel to the third axis X and each having a pair of transverse sides 144, opposing one another and directed in a direction parallel to the first axis Y. The transverse sides 144 of each hexagonal frame 150A are contiguous at the transverse sides 144 of the two adjacent hexagonal frames 150A (or, in other words, two adjacent hexagonal frames 150A share a transverse side 144), thus forming a plurality of strips extending parallel to the third axis X. Each hexagonal frame 150A surrounds, in a concentric manner and with a gap, a body region 133' and a source region 134'; furthermore, within every other hexagonal frame 150A, an enriched region 137' is present.

In detail, each body region 133' (of the P type) is of hexagonal shape and accommodates inside it a respective source region 134' (of the N type), these also being of hexagonal shape but having a smaller area than the body region 133'. The enriched regions 137' (of the P type) are disposed between every other source region 134', inside of the same, and these also have a hexagonal shape, but with a smaller area than the respective source region 134'. The body region 133', source region 134' and enriched region 137' are furthermore concentric and have mutually parallel sides.

On top of each area of the body 132 that accommodates the hexagonal frames 150A, a respective isolated gate region is present, here indicated with the reference number 146', of the device 130. In a similar manner to the preceding figures, each gate structure 146' comprises an insulating region, a conductive region and a region of dielectric (not shown).

Each isolated gate region 146' has the shape of a hexagonal ring having a smaller outer perimeter as compared with the perimeter of the respective hexagonal frame 150A; furthermore, each isolated gate region 146' is concentric, when viewed from the top, with the respective hexagonal frame 150A and with the respective body region 133', source region 134' and enriched region 137' (where provided). In detail, each isolated gate region 146' is superposed onto the portion of the respective body region 133' facing the first surface (annular region seen in FIG. 16) and a peripheral portion of the respective source region 134'. As a consequence, the internal parts of the source regions 134' facing the first surface and the enriched regions 137' (where present) are not covered by the isolated gate region 146' and are in direct contact with the first metallization layer (not shown), forming a JBS diode (53 in FIG. 5), in a similar manner to what was discussed with reference to FIGS. 3-4.

Between adjacent pairs of strips of implanted regions 150, portions of the body 132 are present that do not have the implanted regions but accommodate body regions 133", source regions 134" and enriched regions 137". The body regions 133", source regions 134" and enriched regions 137" are disposed in a similar manner to the body regions 133', source regions 134' and enriched regions 137', but are offset by a half-step in a direction parallel to the third axis X. On top of the body region 133" and source region 134", isolated gate regions 146" are present having exactly the same shape and disposition of the isolated gate regions 146' described above.

In this manner, laterally to the implanted regions 150, portions of the body 132 are present facing the first surface of the body itself. These portions of the body 132 form JFET regions 145 analogous to the JFET regions 35 in FIGS. 3-4. In practice, the JFET regions 145 have the shape of a hexagonal ring surrounding, in the view from above in FIG. 16, the isolated gate regions 146', 146".

The result of this is that the metallization layer (not shown) in direct contact with the JFET regions 145 and with the implanted regions 150 form JBS diodes, in a manner analogous to what was described for the devices 20, 60 and 90.

Finally, it is clear that modifications and variants may be applied to the device and process described and illustrated here without however straying from the scope of protection of the present disclosure.

In particular, the isolated gate structures may have a different shape; for example they may have circular or different polygonal shapes with respect to that shown in FIG. 16.

Furthermore, in the embodiment in FIG. 16, portions of the implanted region 150 may extend in a direction parallel to the first axis Y from the corners of each hexagonal frame 150A as far as corresponding corners of an adjacent strip. In practice, in this way, the implanted region 150 no longer forms strips, but extends in a honeycomb over the whole plane XY.

The enriched regions 27A-27D may also be disposed in a manner different from what is shown, both as regards their lateral extension (direction Y) and as regards their staggering.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing process for an integrated MOSFET device comprising:
   forming a first body region in a body of silicon carbide having a first type of conductivity, a first surface, and a second surface, the first body region having a second type of conductivity and extending from the first surface into the body, the first body region bounding a JFET region of the body, the JFET region extending from the first surface;
   forming a first source region, with the first type of conductivity, extending from the first surface into the first body region;
   forming an implanted structure, with the second type of conductivity, inside of the JFET region, starting from the first surface;

forming an isolated gate structure, on the first surface in a position lying partially over the first body region, the first source region, and the JFET region; and forming a first metallization layer on the first surface in direct contact with the implanted structure and with the JFET region, the first metallization layer forming a JBS diode with the implanted structure and the JFET region.

2. The process according to claim 1, further comprising:
forming a second body region, with the second type of conductivity, extending from the first surface into the body, laterally to the JFET region; and forming a second source region, with the first type of conductivity, extending from the first surface into the second body region, wherein:

forming the isolated gate structure comprises forming a first isolated gate region and a second isolated gate region, the first isolated gate region lies partially over the first body region, the first source region, and the JFET region, the second isolated gate region lies partially over the second body region, the second source region, and the JFET region, and the first and the second isolated gate regions are separated by a gap having a length in a first direction, the JFET region disposed below the gap accommodating the implanted structure.

3. The process according to claim 2, further comprising:
forming a first enriched region, with the second type of conductivity, extending from the first surface into the first source region; and forming a second enriched region, with the second type of conductivity, extending from first surface into the second source region, the first and second enriched regions being mutually offset with respect to a second direction transverse to the first direction.

4. The process according to claim 3, in which forming the implanted structure, forming the first enriched region, and forming the second enriched region comprise implanting doping ionic species in the body of silicon carbide.

5. The process according to claim 2, wherein forming the implanted structure comprises forming a plurality of implanted regions mutually separated by intermediate portions of the JFET region, the first metallization layer forming an ohmic contact with the implanted regions and a Schottky contact with the intermediate portions.

6. The process according to claim 5, wherein forming the implanted regions includes forming the implanted regions with a greater extension in the first direction compared with the width of the gap and forming the first and second isolated gate regions includes partially covering the implanted regions with the first and second isolated gate regions.

7. The process according to claim 5, wherein:
forming the implanted regions includes forming the implanted regions with shorter extensions in the first direction with respect to the width of the gap, the implanted regions bounding lateral portions of the JFET region not covered by the isolated gate regions; and forming the first metallization layer includes forming a further Schottky contact by contacting the first metallization layer with the lateral portions.

8. The process according to claim 2, wherein forming the implanted structure includes forming the implanted structure as a strip region extending longitudinally in a second direction transverse to the first direction.

9. The process according to claim 2, wherein:
forming the first and second isolated gate regions includes forming the first and second isolated gate regions with closed annular shapes and including portions surrounding, when viewed from above, the first and second body regions, respectively;

forming the implanted structure includes forming a first implanted region surrounding, when viewed from above, the first isolated gate region and bounding lateral portions of the JFET region not covered by the isolated gate regions; and forming the first metallization layer includes forming an ohmic contact by contacting the first metallization layer with the first implanted region and forming a Schottky contact by contacting the first metallization layer with the lateral portions.

10. The process according to claim 9, further comprising forming further body regions and further source regions, wherein:

forming the isolated gate structure comprises forming further isolated gate regions aligned with the first isolated gate region in a second direction transverse with respect to the first direction, the further isolated gate regions having closed annular shapes and comprising portions surrounding, when viewed from above, the further body regions, respectively, and the further source regions, respectively;

forming the implanted structure comprises forming further implanted regions surrounding, when viewed from above, the further isolated gate regions, respectively, and bounding further lateral portions of the JFET region not covered by the further isolated gate regions; and forming the first metallization layer includes forming ohmic contacts by contacting the first metallization layer with the further implanted regions and forming Schottky contacts by contacting the first metallization layer with the further lateral portions.

11. The process according to claim 10, wherein the first implanted region and the further implanted regions are mutually connected in the second direction and have shared sides.

12. The device according to claim 10, further comprising:
forming enriched regions, with the second type of conductivity, accommodated in at least some of the further source regions, the enriched regions being disposed alternately in the second direction between every other further source region of the further source regions.

13. The device according to claim 12, wherein:
the first, the second and the further isolated gate regions, the first, the second and the further implanted regions each have a hexagonal ring shape, the first, the second and the further body regions, the first, the second and the further source regions, and the enriched regions have a hexagonal shape.

14. A process of making an integrated metal-oxide semiconductor field effect transistor (MOSFET) device comprising:

forming first and second body regions in a semiconductor body having a first conductivity type, a first surface, and a second surface, the first and second body regions having a second conductivity type and extending from the first surface into the semiconductor body;

forming a junction field effect transistor (JFET) region extending between the first and second body regions and facing the first surface;

forming first and second source regions, with the first conductivity type, extending from the first surface into the first and second body regions, respectively;

forming first and second isolated gate regions, the first isolated gate region lying partially over the first body region, the first source region, and the JFET region, the second isolated gate region lying partially over the second body region, the second source region, and the JFET region, the first and second isolated gate regions being separated from each other by a gap having a width in a first direction and lying over a portion of the JFET region;

forming an implanted structure, with the second conductivity type, extending under the gap and into the portion of the JFET region from the first surface; and forming a first metallization layer extending over the first surface, the first metallization layer being in direct contact with the implanted structure and with the portion of the JFET region and forming a Junction-Barrier Schottky (JBS) diode that includes the implanted structure and the portion of the JFET region.

15. The process according to claim 14, wherein forming the implanted structure comprises forming a plurality of implanted regions mutually separated by intermediate portions of the JFET region, the first metallization layer forming an ohmic contact with the implanted regions and a Schottky contact with the intermediate portions.

16. A process, comprising:
forming first and second body regions in a semiconductor body having a first conductivity type, a first surface, and a second surface, the first and second body regions having a second conductivity type, extending from the first surface into the semiconductor body, and delimiting a junction field effect transistor (JFET) region facing the first surface;

forming first and second source regions, with the first conductivity type, extending from the first surface into the first and second body regions, respectively;

forming an implanted structure, with the second conductivity type, extending into the JFET region from the first surface; and forming first and second isolated gate regions, the first isolated gate region lying partially over the first body region, the first source region, and the JFET region, the second isolated gate region lying partially over the second body region, the second source region, and the JFET region, each of the first and second isolated gate regions having an insulating layer extending on the first surface, a conductive layer extending over the insulating layer; and a dielectric layer extending over the respective conductive layer, the first and second isolated gate regions being separated from each other by a gap having a width in a first direction and lying over a portion of the JFET region accommodating the implanted structure, thereby the first surface of the body forms first surface portions of the JFET region extending under the gap and delimited by the implanted structure and second surface portions contiguous to the first surface portions of the JFET region and extending under the first and second isolated gate regions;

forming a first metallization layer extending over the first and second isolated gate regions, the first surface, and in the gap between the first and second isolated gate regions, the first metallization layer being in direct contact with the implanted structure and with the first surface portions of the JFET region and forming a Junction-Barrier Schottky (JBS) diode that includes the implanted structure and the first surface portions of the JFET region.

17. The process according to claim 16, wherein forming the implanted structure comprises forming implanted regions mutually separated by intermediate portions of the JFET region, the first metallization layer forming an ohmic contact with the implanted regions and a Schottky contact with the intermediate portions.

18. The process according to claim 17, wherein forming the implanted regions includes forming the implanted regions with a greater extension in the first direction compared with the width of the gap.

19. The process according to claim 16, wherein forming the implanted structure includes forming the implanted structure as a strip region extending longitudinally in a second direction transverse to the first direction.

20. The process according to claim 16, wherein:
forming the first and second isolated gate regions includes forming the first and second isolated gate regions with closed annular shapes and including portions surrounding, when viewed from above, the first and second body regions, respectively;

forming the implanted structure includes forming a first implanted region surrounding, when viewed from above, the first isolated gate region and bounding lateral portions of the JFET region not covered by the isolated gate regions; and forming the first metallization layer includes forming an ohmic contact by contacting the first metallization layer with the first implanted region and forming a Schottky contact by contacting the first metallization layer with the lateral portions.

* * * * *